US006359439B1

(12) United States Patent
Crecelius et al.

(10) Patent No.: US 6,359,439 B1
(45) Date of Patent: Mar. 19, 2002

(54) COMPRESSION SENSE IGNITION SYSTEM WITH FAULT MODE DETECTION AND HAVING IMPROVED CAPACITIVE SENSING

(75) Inventors: David Ross Crecelius; Gerard Darryl Nichols; Royland Anthony Walker, all of Indianapolis, IN (US); Steven Mark Bezdek, Haslett, MI (US); Joel Franklin Downey, Kokomo, IN (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 09/523,791

(22) Filed: Mar. 13, 2000

(51) Int. Cl.[7] .......................... F02P 17/00; F02P 17/12; G01R 15/16

(52) U.S. Cl. ...................... 324/391; 324/388; 324/378; 701/103; 701/114; 701/115; 123/644; 73/116

(58) Field of Search ...................... 123/406.13, 406.14, 123/406.18, 406.27, 406.58, 435, 436, 479, 630, 634, 644; 701/101, 102, 103, 114, 115; 73/116, 117.3; 324/378, 380, 388, 391, 399, 402

(56) References Cited

U.S. PATENT DOCUMENTS

| | | | | |
|---|---|---|---|---|
| 5,063,901 A | * 11/1991 | Kaneyasu et al. | 123/406.13 |
| 5,129,379 A | * 7/1992 | Kaneyasu et al. | 123/436 |
| 5,172,302 A | * 12/1992 | Taruya et al. | 123/644 |
| 5,218,936 A | 6/1993 | Pritz et al. | 123/143 C |
| 5,237,278 A | * 8/1993 | Bumen | 324/388 |
| 5,237,279 A | * 8/1993 | Shimasaki et al. | 324/391 |
| 5,410,253 A | 4/1995 | Evans et al. | 324/391 |
| 5,561,379 A | 10/1996 | Downey | 324/391 |
| 5,571,245 A | * 11/1996 | Ooyabu et al. | 123/644 |
| 5,668,311 A | * 9/1997 | Kiess et al. | 73/116 |
| 5,672,972 A | * 9/1997 | McCoy et al. | 324/391 |
| 5,692,484 A | 12/1997 | Downey | 123/643 |
| 5,819,713 A | 10/1998 | Kesler | 123/630 |
| 5,915,367 A | * 6/1999 | Oishi et al. | 123/644 |
| 6,029,631 A | * 2/2000 | Jiewertz et al. | 324/391 |

FOREIGN PATENT DOCUMENTS

| | | | |
|---|---|---|---|
| EP | 1035323 A2 * | 9/2000 | 324/391 |

* cited by examiner

*Primary Examiner*—Willis R. Wolfe
(74) *Attorney, Agent, or Firm*—Margaret A. Dobrowitsky

(57) ABSTRACT

A compression sense ignition system includes a sensing capacitor having a conductive sensing element disposed in proximity to the secondary winding leads of a first and a second ignition coil for developing a compression sense ignition signal. Epoxy potting material encapsulates the leads and the sensing element to reduce variation of the effective capacitance of the sensing capacitor. The compression sense ignition signal is processed to generate a cylinder identification signal which is used to determine absolute engine position. A fault mode detection and correction scheme is implemented wherein a controller responsive to the cylinder identification signal can determine correct absolute engine position notwithstanding the occurrence of one or more engine or ignition system faults which may impair the cylinder identification signal.

24 Claims, 5 Drawing Sheets

COMPRESSION SENSE IGNITION SYSTEM WITH FAULT MODE DETECTION AND HAVING IMPROVED CAPACITIVE SENSING

INCORPORATION BY REFERENCE

U.S. Pat. No. 5,410,253 entitled "METHOD OF INDICATING COMBUSTION IN AN INTERNAL COMBUSTION ENGINE", issued Apr. 25, 1995, and, U.S. Pat. No. 5,561,379 entitled "REMOTE PLANAR CAPACITIVE SENSOR APPARATUS FOR A DIRECT IGNITION SYSTEM", issued Oct. 1, 1996, are hereby incorporated by reference in their entireties.

BACKGROUND OF THE INVENTION

1. Field of the Invention

The present invention relates generally to ignition systems, and, more particularly, to a system for determining a fault mode in an ignition system and having an improved capacitive sensor apparatus.

2. Description of the Related Art

There has been much investigation into systems for determining absolute engine position information in an internal combustion engine. One known approach involves the use of a so-called compression sense system as seen by reference to U.S. Pat. No. 5,410,253 to Evans et al. As background, it is generally understood by those skilled in the art of ignition control that a relationship of proportionality exists between cylinder pressure magnitude and the magnitude of a breakdown voltage across a given spark plug gap. For example, in a direct ignition system (DIS), the spark plug in a cylinder undergoing compression requires a higher voltage across its gap for breakdown than does its counterpart spark plug in a cylinder undergoing a lower pressure exhaust event. Inasmuch as two spark plugs share a common source of ignition energy in such a direct ignition system, the spark plug in the high pressure cylinder will generally require more time to reach its breakdown voltage than will the plug in the lower pressure cylinder. This time difference is generally measurable. Evans et al. discloses a system that analyzes the time relationship of the discharge ignition voltage across pairs of spark plugs in such systems to provide direct information on which plug, and thus which cylinder, is in its compression stroke (or alternatively in its exhaust stroke). Absolute engine position information is needed to synchronize relative position inputs to an engine controller to provide for proper fuel delivery timing during the engine cycle. While known implementations of compression sense technology have eliminated the need for additional hardware (e.g., camshaft position sensor) to sense absolute engine position, certain fault modes in the engine and/or ignition system have, heretofore, prevented full utilization of compression sense system outputs.

Concerning particular compression sense implementations, it is further known to use a capacitive sensor to sense the breakdown events, and thus the relative time differences, as described above as seen by reference to U.S. Pat. No. 5,561,379 to Downey. Downey discloses a pair of planar conductive plates remote from each of the leads of a secondary winding of an ignition coil to capacitively couple ignition voltages to a common node. The common node is coupled as an input to a processing circuit for determination of absolute engine position. Such secondary winding leads, and planar conductive plates are each at least partially immersed in an epoxy potting material, which forms a dielectric for capacitive coupling therebetween. Downey discloses an air space between the exposed surfaces of the potting material in which the conductive plates and the winding leads are immersed. That is, Downey discloses three, stacked layers of dielectric material between the "plates" of the sensing capacitor: (i) a first potting material layer; (ii) an "air" layer; and, (iii) a second potting material layer. The dielectric contribution of the "air" layer, however, varies based on changing conditions (e.g., introduction of water into such air layer), thereby presenting challenges to the designers of circuitry for processing the sensed ignition voltages.

Accordingly, it would be desirable to provide an ignition system, including a suitable sensing structure, that improves on the known systems described above.

SUMMARY OF THE INVENTION

The present invention provides accurate information regarding engine absolute position, even when engine or ignition system fault modes are present. In addition, an improved, integral sensing element is configured to capacitively sense spark discharges associated with multiple ignition coils, and further, is configured so that an effective capacitive dielectric constant is maintained relatively constant.

In one aspect of the present invention, a method for determining absolute engine position is provided. The method is suitable for use in an ignition system for a multi-cylinder internal combustion engine. There are four basic steps. The first step involves defining a cylinder identification signal indicative of a respective combustion event in each of the cylinders. The next step involves providing a data structure. The data structure includes an input parameter and an output parameter. The input parameter has a plurality of values corresponding to the cylinder identification signal in the presence of one or more fault modes. In a preferred embodiment, the input parameter may comprise a 4-bit CAM code, which is the cylinder identification signal sampled four times at predetermined intervals during one complete firing sequence of the engine. Further, each input parameter has a respective output parameter associated therewith indicative of absolute engine position. In one embodiment, the output parameter may comprise a value indicative of which cylinder was last under compression. The third step involves generating the cylinder identification signal in accordance with a compression sense detection strategy (i.e., during operation). Finally, the last step involves selecting one of the output parameters contained in the data structure using the generated cylinder identification signal. Advantageously, the method provides absolute engine position, even during occurrence of fault modes.

In another aspect of the present invention, a method of determining a fault mode in an ignition system is provided. The method is suitable for use in an internal combustion engine having a plurality of cylinders. The method includes the step of defining a plurality of fault modes associated with the engine or the ignition system as a function of a cylinder identification signal. The cylinder identification signal is indicative of an occurrence of a combustion event in each of the respective cylinders. The next step involves generating the cylinder identification signal in accordance with a compression sense detection strategy. Finally, the last step involves selecting at least one of the fault modes using the cylinder identification signal. This information may be provided to service technicians for improved servicing.

In yet another aspect of the present invention, a direct ignition apparatus is provided which includes a housing, a pair of ignition coils, a sensing conductive element, dielectric material, and an ignition signal processing circuit. The pair of ignition coils are disposed in the housing, and each coil has a secondary winding configured to develop an ignition voltage at respective first ends thereof. Each one of the first ends of the secondary windings is configured to be connected to first and second spark plugs. Each plug is disposed in a corresponding cylinder of the internal combustion engine. The ignition voltage so developed is configured to cause the spark plugs to produce a respective spark discharge. The sensing conductive element may include a generally planar portion disposed a predetermined distance from the pair of ignition coils. Preferably, the generally planar portion may be located proximate the leads of the secondary windings for increased capacitive coupling.

Advantageously, the dielectric material substantially occupies the space between the ignition coils and the planar portion of the sensing conductive element. That is, there is no "air" layer that may be subjected to changing conditions that would change the capacitive dielectric constant. During spark discharge, the flow of spark current is capacitively coupled to the sensing conductive element to produce a corresponding ignition signal voltage. The ignition signal processing circuit is electrically connected to the sensing conductive element, and is configured to generate, in a preferred embodiment, a cylinder identification signal indicative of an occurrence of an ignition event.

Other objects, features, and advantages of the present invention will become apparent to one skilled in the art from the following detailed description and accompanying drawings illustrating features of this invention by way of example, but not by way of limitation.

DETAILED DESCRIPTION OF THE PREFERRED EMBODIMENTS

Figure 1:
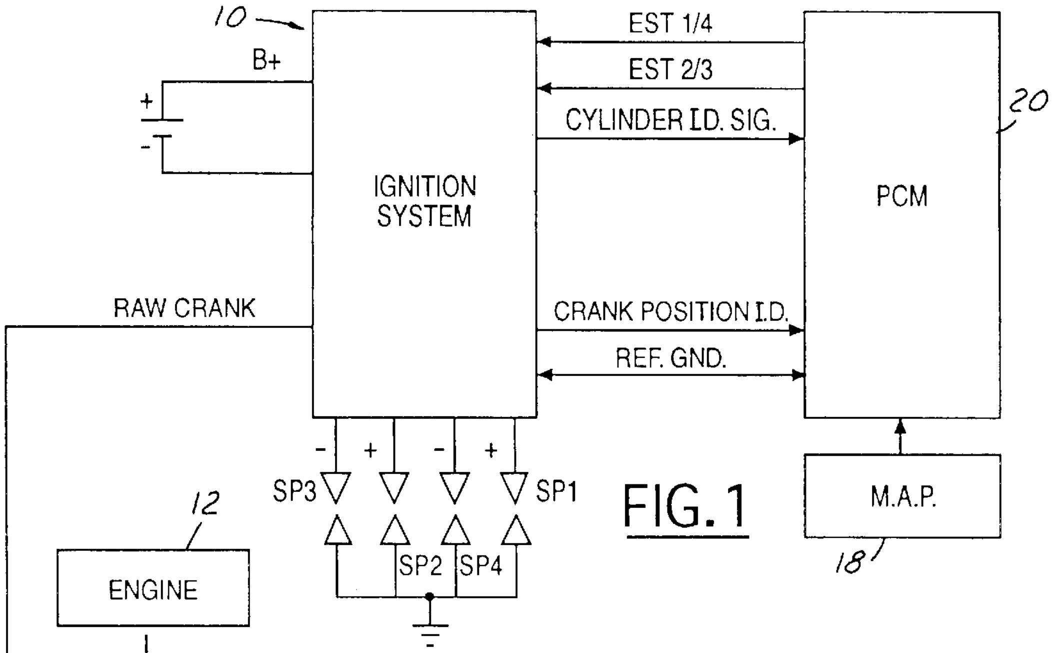
FIG. 1 is a simplified schematic and block diagram view of an ignition system in accordance with the present invention.

Referring now to the drawings wherein like reference numerals are used to identify identical components in the various views, FIG. 1 illustrates an ignition system 10. However, before, proceeding to a description of the particular improvements occasioned by the present invention, a general description of inventive ignition system 10 will be set forth.

Ignition system 10 is suitable for use with an internal combustion engine 12 of the type having a crankshaft 14, and a plurality of pistons disposed in a corresponding plurality of cylinders (not shown). In the illustrated embodiment, ignition system 10 is electrically coupled to a plurality of spark plugs designated SP1, SP2, SP3, and SP4. System 10 is further electrically coupled to an engine crankshaft position sensor 16. FIG. 1 further shows a manifold absolute pressure (MAP) sensor 18 coupled to a controller, such as a powertrain control module (PCM) 20.

In the described embodiment, engine 12 comprises a 4-cylinder internal combustion engine. Spark plugs SP1, SP2, SP3, and SP4 are respectively disposed in first, second, third, and fourth cylinders of engine 12. Furthermore, in the described embodiment, ignition system 10 comprises a direct ignition system (DIS) wherein pairs of spark plugs are coupled to a single supply of ignition energy, such as a single ignition coil. As will be described in further detail hereinafter, in the illustrated and described embodiment, a first pair of spark plugs, SP1 and SP4, are associated with a corresponding pair of cylinders, namely cylinders 1 and 4. Plugs SP1 and SP4 are associated with a first ignition coil. A second pair of spark plugs, SP2 and SP3, are associated with a corresponding pair of cylinders, namely cylinders 2 and 3. Plugs SP2 and SP3 are associated with a second ignition coil. The foregoing is exemplary only and is made for purposes of describing the invention and is therefore not limiting in nature.

With continued reference to FIG. 1, ignition system 10 is coupled to a vehicle battery which provides a supply voltage, hereinafter designated "B+" in the drawings. Supply voltage B+ may nominally be approximately 12 volts.

Crankshaft position sensor 16 may comprise conventional components known to those of ordinary skill in the art. For example, it is known to configure crankshaft 14 with a ferrous disk with notches spaced at predetermined intervals along the circumference thereof, and further to provide one further notch at a reduced predetermined interval to indicate a reference position. It is further known to provide sensor 16 as a non-powered, variable reluctance inductive type sensor. The notches pass beneath the sensor as the crankshaft turns, generating a signal indicative of crankshaft position. It should be understood by those of ordinary skill in the art that in such known systems, ignition system 10 may include interface circuitry as may be desirable to condition and format the raw crankshaft position indicative signal into a form suitable for use. In the illustrated embodiment, ignition system 10 includes such circuitry and provides a crank pulse position identification signal to PCM 20. In the illustrated and described embodiment, the crank pulse position identification signal comprises a seven pulse per single crankshaft revolution (i.e., 7X) signal wherein six of the pulses are relatively evenly spaced with a seventh pulse being narrowly spaced from the sixth pulse to thereby indicate a reference position. The reference position of crankshaft may be relative to a cylinder top dead center position (e.g., cylinder #1 or cylinder #4). This is shown in exemplary fashion in FIG. 7B.

With continued reference to FIG. 1, in the illustrated embodiment, PCM 20 is configured to generate a pair of ignition control signals EST1/4 (electronic spark timing for cylinder #1 and cylinder #4) and EST2/3 (electronic spark timing for cylinder #2 and cylinder #3). The ignition control signals define the initial charging time (e.g., duration), and the relative timing (e.g., relative to cylinder top dead center) of when an ignition spark is desired to occur. In the illustrated embodiment, both ignition control signals EST1/4 and EST2/3 are applied as a positive going pulse having a duration corresponding to a desired primary ignition coil charge time. Charging of the ignition coil for cylinders 1 and 4 commences at the time of receipt of a rising (positive going) edge of the ignition control signals EST1/4. Alternatively, charging of the coil for cylinders 2/3 commences on the rise of EST2/3. Upon receipt of a falling (negative going) edge of one of the ignition control signals EST1/4 and EST2/3, the primary current in the respective ignition coil is interrupted to thereby deliver stored energy to the selected pair of spark plugs. For example, the assertion (dwell), and subsequent deassertion (spark) of ignition control signal EST1/4 causes spark energy to be delivered to spark plugs SP1 and SP4. The configuration of engine 12 is such that when one of the paired cylinders (e.g., cylinder 1) is in a compression stroke, the other one of the paired cylinders (e.g., cylinder 4) is in an exhaust stroke. While the spark energy is configured to create a spark across the gap of both paired spark plugs, for example, spark plugs SP1 and SP4, it is desirable to know, for synchronization purposes, which cylinder was in compression when the spark discharge occurred. The cylinder identification signal (hereinafter "cylinder ID signal") is provided by ignition system 10 for such purpose. In the illustrated and described embodiment, the cylinder ID signal comprises a digital signal that is generated as a logic high when the most recent compression stroke was for an "odd" numbered cylinder, and is a logic low when the most recent compression stroke was for an "even" numbered cylinder. Since the cylinder firing order of engine 12 in the illustrated embodiment is 1-3-4-2, the cylinder ID signal (sometimes referred to herein as a CAM signal in view of its function) nominally assumes a 50% duty cycle (D/C) under normal operation. PCM 20, with knowledge of which cylinder pair (1/4 or 2/3) was being fired, and, with further knowledge of whether the cylinder number under compression was "even" or "odd", can determine absolute engine position.

In the illustrated embodiment, PCM 20 includes a controller which has computing capability, which may be a conventional single chip microcontroller having input/output (I/O), Random Access Memory (RAM), Read Only Memory (ROM), as well as a Central Processing Unit (CPU) core. As is known, ROM may be provided for read only storage of program instructions, data constants and calibration values. The CPU may be provided for reading and executing program instructions stored in ROM for carrying out the control established by the present invention. RAM may be usefully employed for storage of data of the type which may be cleared when, for example, ignition power is removed.

In accordance with the present invention, and as will be described in further detail hereinafter, PCM 20 includes predetermined data stored in memory. The predetermined data comprises a first data structure, such as a look-up table, which takes an input parameter, such as an n-bit digital word pattern and provides an output parameter, such as a numerical indication of which cylinder was last under compression. The predetermined data may further include a second data structure for using such n-bit word, optionally in conjunction with a manifold absolute pressure (MAP) signal, and a misfire indicative signal, to provide an indication of an engine/ignition system failure or fault mode.

Figure 2:
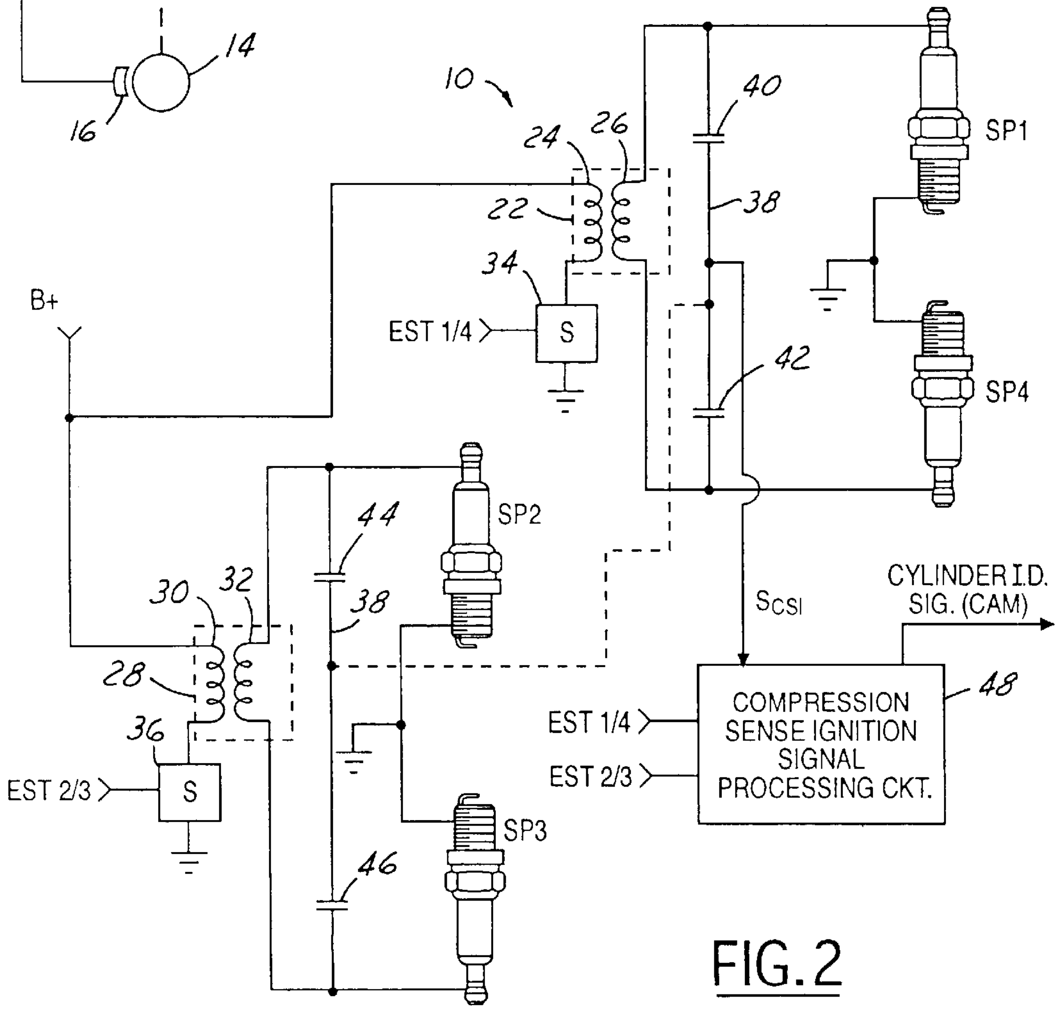
FIG. 2 is a simplified schematic and block diagram view showing, in greater detail, a portion of the ignition apparatus shown in FIG. 1.

FIG. 2 shows a portion of ignition system 10 in greater detail. Ignition system 10 includes a first ignition coil 22 having a primary winding 24 and a secondary winding 26, a second ignition coil 28 having a primary winding 30 and a secondary winding 32, a first switch 34, a second switch 36, a sensing conductive element 38 (best shown in FIG. 3), a plurality of sense capacitors 40, 42, 44, 46, and a compression sense ignition signal processing circuit 48.

First and second ignition coils 22 and 28 are each configured to function as a selectively controllable step-up transformer. One end, such as a high side end, of each of the primary windings 24, 30 is connected to a supply voltage (e.g., B+) generated by the vehicle battery. A second end (opposite the high side end) of each primary winding 24, 30 is connected to a respective switch 34, and 36. A first end (namely the high side end) of each secondary winding 26, 32, is coupled to respective spark plugs SP1, and SP2. In addition, a second end (namely the low side end) of each secondary winding 26, 32, is connected to respective spark plugs SP4, and SP3. Spark plugs SP1 and SP4 define a first pair of spark plugs while spark plugs SP2 and SP3 define a second pair of spark plugs.

Switches 34, and 36 are provided to selectively connect the primary windings 24, and 30 to ground in accordance with a respective one of the ignition control signals EST1/4 and EST2/3. Such a connection to ground, as is known generally in the art, will cause a primary current $I_p$ to flow through each of the primary windings when so commanded. Switches 34, and 36 are illustrated in the Figures as block diagrams; however, it should be understood that switches 34 and 36 may comprise conventional components known to those of ordinary skill in the art, such as, for purposes of example only, a darlington transistor configuration. It should be understood that either or both of switches 34, and 26 may comprise alternative conventional components known in the art.

Coil 22 and switch 34, together, define a first means for selectively storing energy, preferably in a predetermined amount, and thereafter transferring the stored energy to spark plugs SP1, and SP4 in accordance with ignition control signal EST1/4.

Likewise, coil 28, and switch 36, together, define a second means for selectively storing energy, preferably in a predetermined amount, and thereafter transferring the stored energy to spark plugs SP2, and SP3 in accordance with ignition control signal EST2/3.

Figure 6:
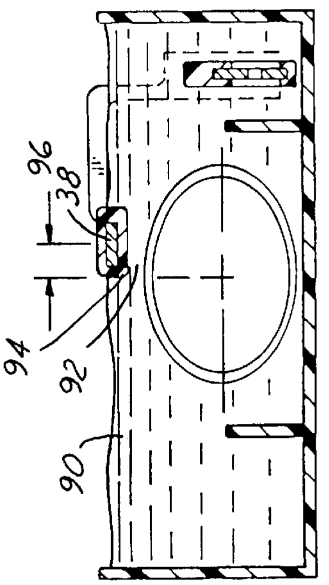
FIG. 6 is a partial, section view taken along lines 6—6 in FIG. 5 illustrating the relative orientation of the compression sense leadframe with respect to an ignition coil.
Figure 3:
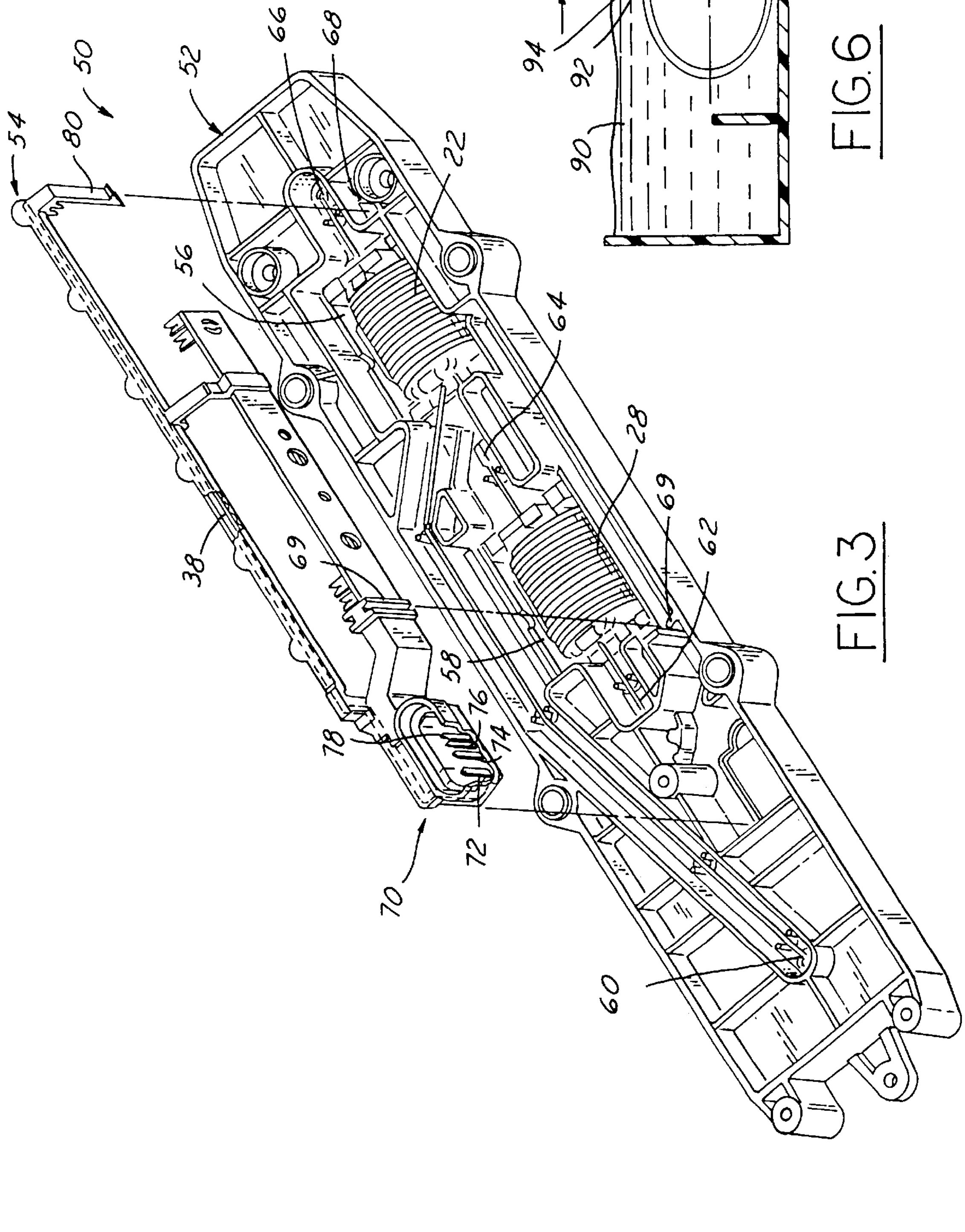
FIG. 3 is an exploded, perspective view of a cassette portion of the ignition system shown in FIG. 1 including a housing portion and a compression sense leadframe portion.
Figure 4:
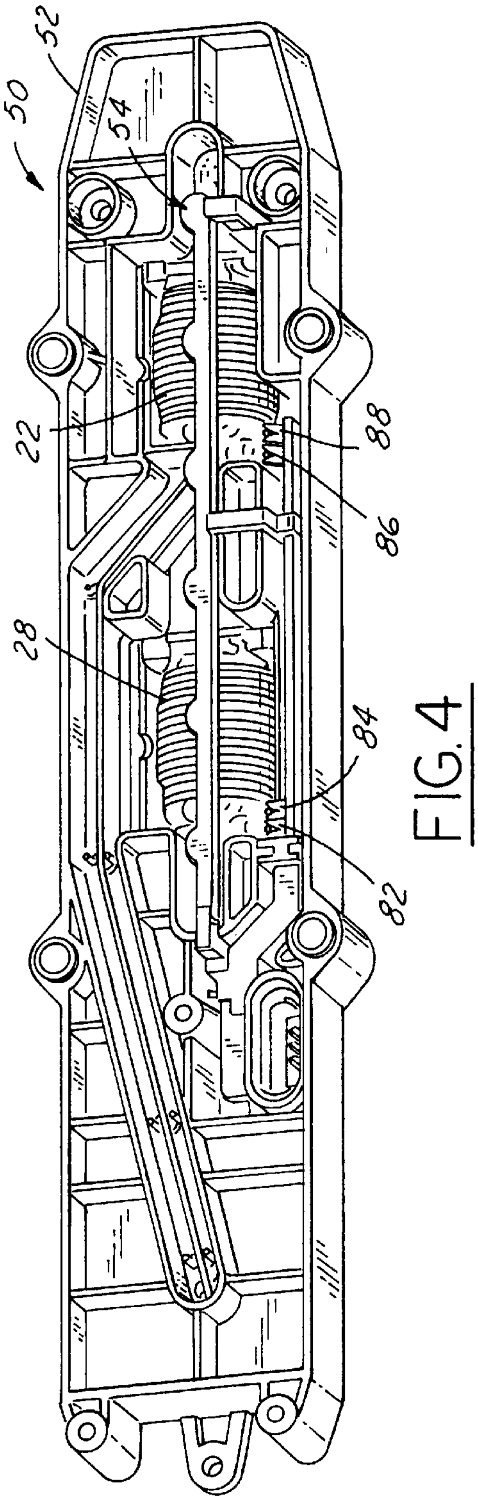
FIG. 4 is a simplified, partially assembled, perspective view of the cassette portion shown in FIG. 3.

Sensing conductive element 38 is disposed in predetermined proximity to both first and second ignition coils 22, and 28 (best shown in FIGS. 4 and 6). As described in detail in U.S. Pat. No. 5,561,379 entitled "REMOTE PLANAR CAPACITIVE SENSOR APPARATUS FOR A DIRECT IGNITION SYSTEM", hereby incorporated by reference, it is known to use a conductive element as one "plate" of a "parallel plate" sensing capacitor. In accordance with the present invention, conductive element 38 forms one "plate" of a plurality of sensing capacitors 40, 42, 44, and 46. A detailed description of the structural arrangement will be set forth hereinafter. Conductive element 38 is responsive to an electrical current, namely, a current associated with a spark discharge, to develop a voltage signal, hereinafter designated a compression sense ignition signal, $S_{CSI}$. Although sensing element 38 is shown in FIG. 2 as two (2) separate elements, this representation is schematic only; conductive element 38 is unitary (i.e., one piece). This is best shown in FIG. 3, and the unitary nature of element 38 is indicated graphically in FIG. 2 by a dashed-line connection between the separate schematic elements each labeled "38".

Compression sense ignition signal processing circuit 48 is configured to generate the cylinder ID signal in accordance with a plurality of sensed spark discharge events. These events correspond to respective compression strokes of the pistons in the cylinders of engine 12. As described above, in the illustrated and described embodiment, the cylinder ID signal comprises a digital signal that is generated as a logic high when the most recent compression stroke was for an "odd" numbered cylinder, and is a logic low when the most recent compression stroke was for an "even" numbered cylinder. Suitable circuit configurations for implementing processing circuit 48 are known in the art, such as described and illustrated in U.S. Pat. No. 5,410,253 entitled "METHOD OF INDICATING COMBUSTION IN AN INTERNAL COMBUSTION ENGINE", issued Apr. 25, 1995, herein incorporated by reference. It should be understood that alternative configurations may be employed and remain within the spirit and scope of the present invention.

Industrial Applicability

In one aspect of the present invention, an inventive structure for sensing ignition events is provided in a "leadframe" package. FIG. 3 is a perspective, exploded view of a cassette portion 50 of ignition system 10. Cassette portion 50 includes a housing portion 52, and a leadframe assembly 54 comprising the aforementioned conductive element 38 according to the present invention.

The purpose of the cassette configuration of cassette 50 is to allow the entire ignition system to be installed or removed from engine 12 as a unit. Housing 52 includes a first cavity 56 configured to receive ignition coil 22 (i.e., for cylinders 1/4), and further includes a second cavity 58 configured to receive ignition coil 28 (i.e., for cylinders 2/3). On a bottom surface of housing 52 extends four high voltage terminals (not shown), one high voltage terminal for each of the four cylinders in the exemplary engine 12. As is generally understood, each high voltage terminal is configured to be connected to a spark plug boot, which provides a high voltage electrical connection to each of the spark plugs SP1, SP2, SP3, and SP4, respectively. As shown in FIG. 3, housing 52 further includes four electrical connecting features designated 60, 62, 64, and 66 for connecting a respective end of a secondary winding of each ignition coil to the above-described four high voltage terminals. Housing 52 further includes a locating feature 68 which cooperates with a corresponding feature disposed on leadframe 54. Housing 52 may be manufactured using well known materials that are generally insulating in nature, such as, for purposes of example only, glass-filled polyester, or other plastic type materials.

Compression sense leadframe 54 is molded and overmolded into a single piece for ease of high volume assembly (i.e., single drop-in part). Leadframe 54 comprises a combination of generally conductive, and non-conductive materials. Leadframe guides (e.g., designated at, for example, 69) allow leadframe 54 to be positioned repeatedly in the same location. This provides robust ignition coil-to-sensing element 38 capacitive coupling. Leadframe 54 further includes a connector region 70 having four electrically conductive pins 72, 74, 76 and 78. Connector 70 is configured to matingly engage a corresponding connector of an electronics module (not shown) which contains, among other things, the circuitry shown in FIG. 2. The pins 72, 74, 76 and 78 connect through conductive paths of leadframe 54 for the following: pin 72 (to element 38 for signal $S_{CSI}$), pin 74 (to low-side lead of primary winding of coil 28 "$C^{-}$2/3"), pin 76 (to high side of primary windings for B+), and pin 78 (to low-side lead of primary winding of coil 22 "$C^{-}$1/4"). In addition, once connected, pins 72, 74, 76 and 78 connect to the following on the electronics module: Pin 72 ($S_{CSI}$) is electrically connected to circuit 48; Pin 74 is coupled to switch 36; Pin 76 is coupled to B+; and, Pin 78 is coupled to switch 34.

Leadframe 54 further includes the mating portion of the locating feature referred to above, which is designated "80" in FIG. 3. Locating feature 80 on leadframe 54 cooperates with feature 68 (best show in FIG. 3) on housing 52 to maintain a predetermined spacing of the leadframe assembly 54 (and thus conductive element 38) from ignition coils 22 and 28, and more particularly, from the secondary winding terminations thereof.

FIG. 3 shows sensing conductive element 38 as an elongated, plate-like structure extending generally the length of leadframe 54. Sensing element 38 electrically terminates on pin 72 of connector 70.

FIG. 4 shows leadframe assembly 54 as installed in housing 52. The leadframe assembly 54 cooperates with housing 52 so that sensing conductive element 38 is disposed generally above both coils 22, and 28. This arrangement allows spark discharge events from each ignition coil to be processed. More particularly, conductive element 38 is positioned in close proximity to the terminations 60, 62, 64, and 66 of secondary windings 26, 32. This arrangement increases the capacitive coupling between the spark currents from spark discharge events and improves the resulting voltage signal $S_{CSI}$. In addition, by disposing the element 38 above both coils 22, and 28, the capability of generating CAM phasing information to, for example, PCM 20, is provided upon the first ignition control signal pulse (e.g., EST1/4).

Leadframe assembly 54 further includes metal connecting elements 82 ("$C^{-}$2/3"), 84 (B+), 86 ("$C^{-}$1/4"), and 88 (B+). Elements 82, 84, 86 and 88 each include a generally triangular-shaped receiving channel in which the corresponding winding leads are soldered. The metal elements 82, 84, 86, and 88 are conductive, and form an electrical path to a corresponding pin 74, 76, 78 and 76 located at connector region 70, respectively. The conductive portions of leadframe assembly 54 generally comprise metal material, while the non-conductive portions of leadframe 54 may comprise plastic material.

Figure 5:
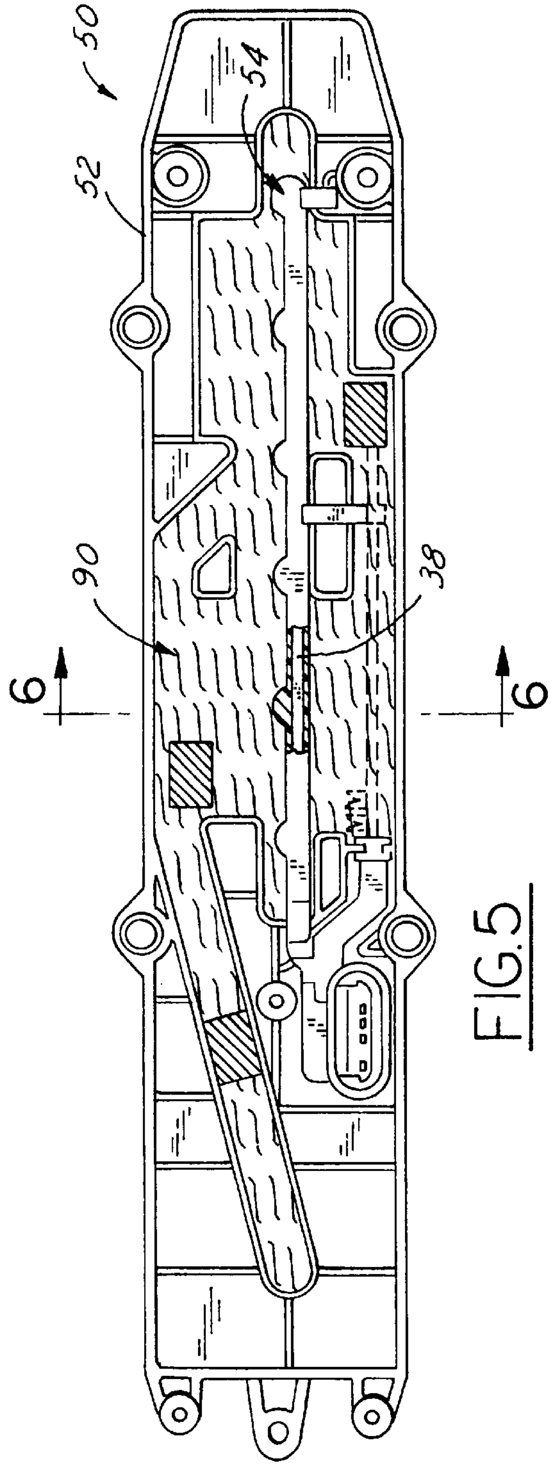
FIG. 5 is a simplified, top view of the cassette portion shown in FIG. 4, further illustrating an epoxy potting material.

FIG. 5 shows leadframe assembly 54 as assembled into housing 52, and further shows an epoxy potting material 90 as flowed or delivered into the voids and cavities of housing 52. Sufficient potting material 90 is introduced so as to reach and encapsulate an underside surface of the part of leadframe assembly 54 that contains the generally planar conductive element 38. Conventional potting materials may be used.

FIG. 6 shows a section of cassette 50 taken along lines 6—6 in FIG. 5. FIG. 6 shows the general level of fill for epoxy potting compound 90. As generally known, a "capacitor" may be formed by interposing dielectric material between two conductive "plates". One "plate" of each of the sensing capacitors 40, 42, 44, and 46 (shown schematically in FIG. 2) is defined by the secondary windings of the ignition coils, particularly including the leads thereof. The second "plate" for each of the capacitors 40, 42, 44, and 46 is defined by the sensing conductive element 38 which forms a common electrical node. As to the "dielectric" material, there are two distinct regions arranged in a "series" relationship. A first layer or region 92 comprising the epoxy potting material 90, contributes a first dielectric amount to each of the sensing capacitors. A second layer or region 94 comprising the plastic material surrounding conductive element 38, contributes a second dielectric amount. As known generally, the effective capacitance of the "plate" capacitors so formed depends on a number of factors, including the effective dielectric constant of the materials between the "plates", the area and geometry of the first "plate" (i.e., sensing conductive element 38), and the size and geometry of the second "plates" (i.e., the secondary windings and electrical terminations thereof). Applicants have discovered that although the dielectric constant of the potting material may change with, for example, temperature, for the frequency of the compression sense ignition signal $S_{CSI}$ being detected, the capacitive dielectrics may be considered substantially constant. In addition, changing environmental conditions (e.g., exposure to water) do not substantially affect the dielectric constants, inasmuch as air spaces are not present to any appreciable degree in the dielectric material of the sensing "capacitors." In addition, sensing element 38 is offset a predetermined distance relative to a center line taken through the ignition coils 22, and 28. This distance is designated "96".

In further aspects of the present invention, a method for maintaining correct absolute engine position information is provided, even in the presence of faults. In a still further aspect, a method for determining the nature of such a fault is provided.

Figures 7A, 7B, 7C, 7D, 7E, 7F, 7G, 7H, 7I:
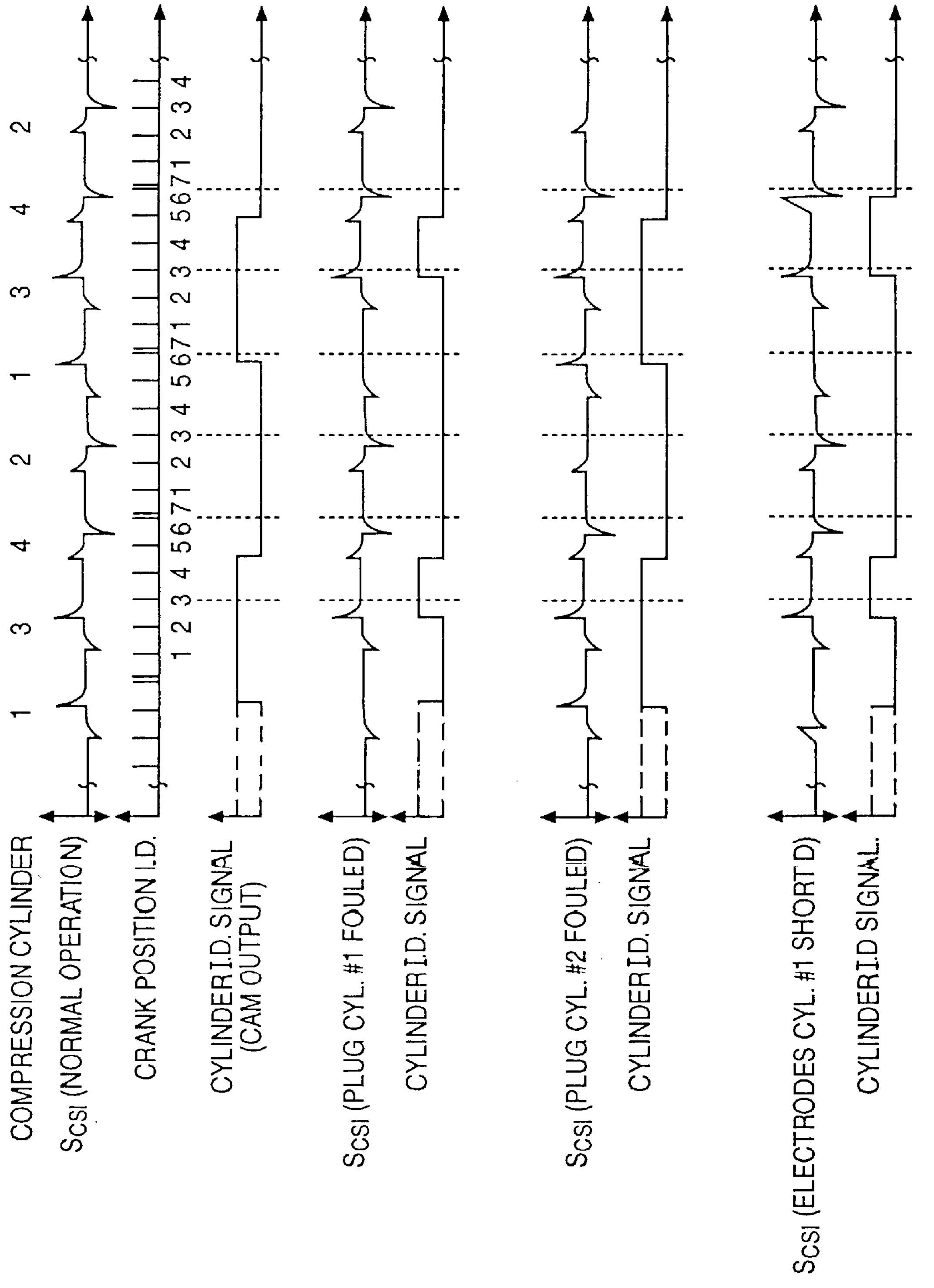
FIGS. 7A–7C are timing diagram views illustrating normal operation of the present invention.
FIGS. 7D–7E are timing diagram views illustrating a compression sense ignition signal and a cylinder identification signal for a fouled spark plug (#1 cylinder) fault condition.
FIGS. 7F–7G are timing diagram views illustrating the compression sense ignition signal and the cylinder identification signal for a fouled spark plug (#2 cylinder) fault condition.
FIGS. 7H–7I are timing diagram views illustrating the compression sense ignition signal and the cylinder identification signal for a shorted spark plug electrode fault condition.
Figures 7J, 7K, 7L, 7M, 7N, 7O:
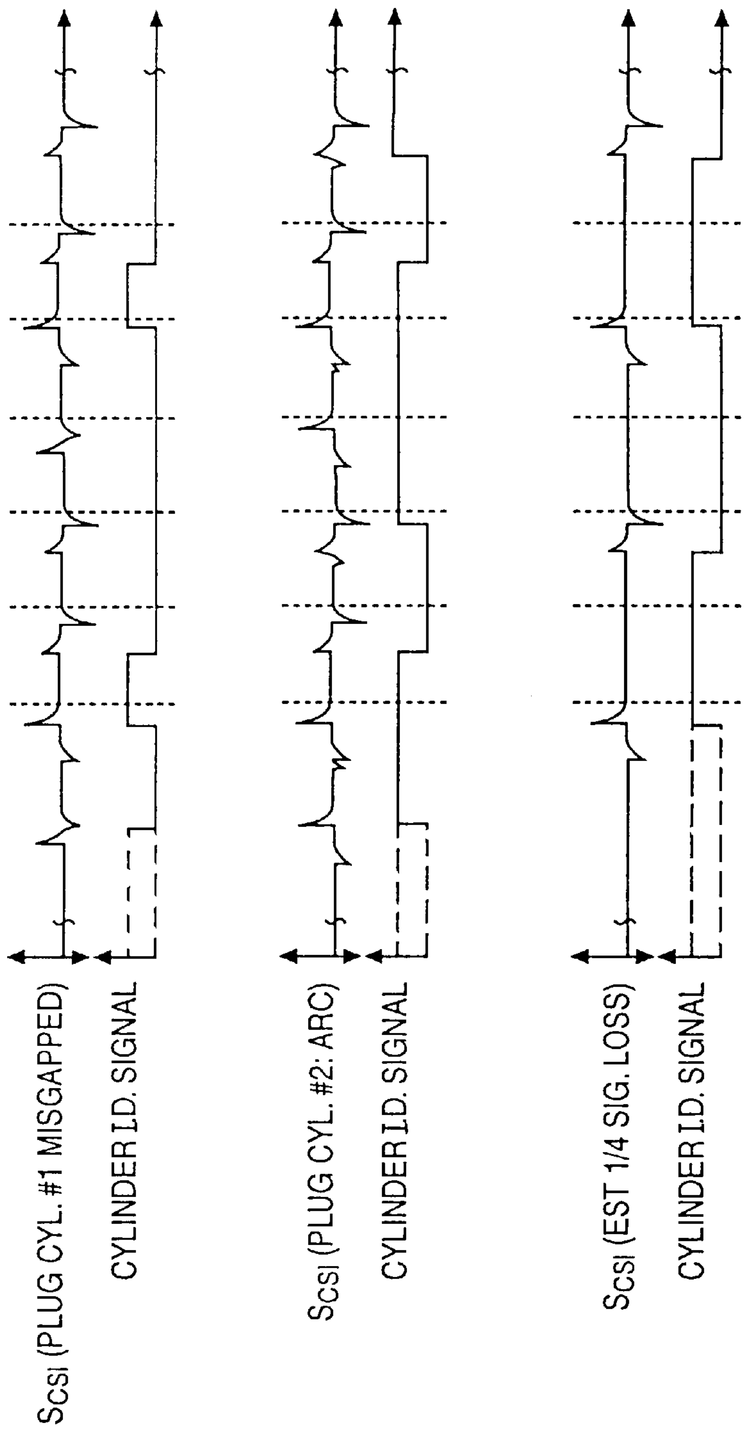
FIGS. 7J–7K are timing diagram views illustrating the compression sense ignition signal and the cylinder identification signal for a misgapped spark plug fault condition.
FIGS. 7L–7M are timing diagram views illustrating the compression sense ignition signal and the cylinder identification signal for a series-arc fault condition; and, FIGS. 7N–7O are timing diagram views illustrating the compression sense ignition signal and the cylinder identification signal for an ignition control signal loss fault condition.

Referring now generally to FIGS. 7A–7O, FIG. 7A shows a timing diagram waveform of a compression sense ignition signal, $S_{CSI}$, during normal operation. "Normal" herein is taken to mean the absence of an engine or ignition system fault or failure that would impair the integrity of the cylinder ID signal, if not for the advances of the present invention. As generally understood in the ignition art, in a waste spark ignition configuration, the spark discharge of the spark plug in the compression cylinder is displaced in time and polarity from the spark discharge of the spark plug in the exhaust cylinder. This time and polarity displacement, along with knowledge of which ignition coil, and thus which pairs of cylinders, is being fired can be used to identify absolute engine position. Absolute engine position can thereafter be used for fuel synchronization.

For example, consider the 1/4 cylinder pairing. When cylinder #1 is in compression, cylinder #4 is in an exhaust stroke. A current pulse produced in the coupling circuitry, arising from the rapid fall of voltage at the spark gap when a spark occurs in the non-compressing cylinder #4, generally precedes the current pulse produced in the coupling circuitry arising from the rapid fall of voltage at the spark gap when a spark occurs in the compressing cylinder #1. These current pulses are converted back into voltages and sensed as the $S_{CSI}$ signal. This timing is due to the understood relationship that the magnitude of the breakdown voltage increases with cylinder pressure. A longer time is therefore generally required for breakdown to occur in the compressing cylinder.

FIG. 7B shows an exemplary crank position ID signal comprising seven pulses, six evenly spaced with an additional seventh pulse corresponding to a reference position.

FIG. 7C shows an exemplary cylinder ID signal (CAM output) produced by ignition system 10 for normal operation. In the illustrated embodiment, the cylinder ID signal should be in a logic high state when the cylinder in which the most recent compression stroke occurred was an "odd" numbered cylinder, and should be in a logic low state when the cylinder in which the most recent compression stroke occurred was an "even" numbered cylinder.

In the illustrated embodiment, the inventive system for (i) maintaining correct absolute engine position, and (ii) detecting fault modes is implemented by way of a programmed configuration of PCM 20. PCM 20 is configured (i.e., programmed) to sample the cylinder ID signal on the third, and sixth crank position pulses, the Figures being arranged in registration relative to these sample times as indicated by several vertically extending dotted lines.

The sampling protocol, in the illustrated embodiment, selects the #3 and #6 crank pulses for sampling because the cylinder ID signal is not valid until the first spark is generated. The first spark (on cylinders 2/3) will occur between crank pulses #1 and #3. The sampled cylinder ID signal is assigned a zero (0) or a one (1) depending on whether the signal was low or high, respectively. Four samples represents one complete firing sequence through the cylinders (i.e., two (2) crankshaft revolutions). The sampling step defines a 4-bit word pattern (hereinafter sometimes referred to as a "CAM CODE") that represents the state of the cylinder ID signal.

As understood in the art, knowledge of the crankshaft position does not unambiguously determine absolute engine position. A sample taken at the #3 crank pulse can validly reflect that cylinder #3 was in compression, or that cylinder #2 was in compression. Therefore, it should be understood that the CAM CODES referred to herein, for any particular condition, "normal" or otherwise, come in pairs: a first 4-bit CAM CODE when cylinder #3 was in compression just prior to the first sample at #3 crank pulse, and a second 4-bit CAM CODE when cylinder #2 was in compression just prior to the first sampled bit. In addition, for the first CAM CODE of the pair, the next cylinder up for compression is cylinder #3, since sampling began on cylinder #3 compression and spanned one complete engine firing sequence. Further, for the second CAM CODE of the pair, the next cylinder up for compression is cylinder #2 for the same reasons. Hereinafter, reference to a pair of CAM CODES for a particular condition, unless stated otherwise, shall be presented in the order described above and shall have the foregoing meaning.

Based on the 4-bit pattern or CAM CODE, PCM 20, through programming in conjunction with predetermined data, can maintain, or in other words provide, the correct cylinder identification (i.e., the cylinder last under compression), even if certain faults in the engine or ignition system have occurred. This allows PCM 20 to properly synchronize fuel delivery even during the presence of a single point fault condition. Moreover, the 4-bit word pattern may be used, in conjunction with other information, such as MAP information, and optionally misfire information, to select or otherwise identify the fault. Thus, with a given CAM CODE, one or two possible failure modes can more easily be identified by PCM 20, and be available or otherwise accessible to repair technicians, resulting in more accurate engine diagnosis and quicker, less costly repair.

With continued reference to FIGS. 7A–7C, the CAM CODE for "normal" operation will be [1001] or [0110], depending on whether the cylinder to have been in compression just before the first sample was cylinder #3, or cylinder #2, respectively. With a CAM CODE of [1001], the next cylinder up for compression will be cylinder #3. With a CAM CODE of [0110], the next cylinder up for compression will be cylinder #2.

Certain fault conditions, Applicants have discovered, will result in the cylinder ID signal deviating from the expected sampled bit pattern and 50% duty cycle. A plurality of fault or failure modes associated with either the engine or the ignition system have been defined in a data structure and associated with a resulting CAM CODE derived from sampling the cylinder ID signal received by PCM 20. The fault modes include but are not limited to: a fouled spark plug condition, a shorted spark plug electrode condition, a spark plug gap mismatch condition, a spark plug circuit series-arc condition, a cylinder low pressure condition, and a loss of ignition control signal EST1/4 or EST2/3 condition. This list is exemplary and not limiting in nature.

FIGS. 7D and 7E are timing diagrams showing the effect on the $S_{CSI}$ signal and the cylinder ID signal for a fouled spark plug on cylinder #1 fault condition. In FIG. 7D, the spark plug for cylinder #1 does not fire, at least during the cylinder #1 compression stroke, and therefore no $S_{CSI}$ signal is generated for cylinder #1 compression. As shown, however, notwithstanding the fault condition, the spark plug for cylinder #1 may nonetheless still fire when in cylinder #1 is in its exhaust stroke (i.e., when cylinder #4—the paired cylinder—is in compression). The $S_{CSI}$ signal for cylinder #1 may therefore be generated at that time. As shown in FIG. 7E, the cylinder ID signal changes. In particular, the cylinder ID signal is now a 25% duty cycle signal, with a rise from a logic low to a logic high on compression for cylinder #3, and a fall from a logic high to a logic low on compression for cylinder #4. The resulting CAM CODES are [1000] and [0010]. This information is organized in a data structure (Table 1 to be described hereinafter) for fault detection.

FIGS. 7F and 7G are timing diagram views of the $S_{CSI}$ signal, and the cylinder ID signal for a fouled plug on cylinder #2 fault condition. No $S_{CSI}$ is generated for cylinder #2, at least during the cylinder #2 compression stroke, since there is no spark discharge. However, as shown in FIG. 7F, and notwithstanding the fault condition, the spark plug for cylinder #2 may nonetheless still fire during the cylinder #2 exhaust stroke (i.e., when cylinder #3—the paired cylinder—is in compression). The $S_{CSI}$ signal for cylinder #2 may therefore be generated at that time. As shown in FIG. 7G, however, this condition does not affect the cylinder ID signal, which is the same as for normal operation (as shown in FIG. 7C). The resulting CAM CODES are [1001] and [0110]. Likewise, but not shown, a fouled plug on cylinder #3 results in a cylinder ID signal having a 25% duty cycle with a rise (low-high) on compression for cylinder #1, and a fall (high-low) on compression for cylinder #3. The resulting CAM CODES for this condition are [0001] and [0100]. Additionally, but also not shown, a fouled plug for cylinder #4 has no effect on the cylinder ID signal. The resulting CAM CODES for this condition are [1001] and [0010]. A fouled plug type of fault, however, will result in a misfire, and may be detected using misfire information in conjunction with the CAM CODE.

Another condition involves shorted spark plug electrodes. FIGS. 7H, and 7I show the resulting $S_{CSI}$ signal, and cylinder ID signal. Note that for an electrode short on cylinder #1 condition, no $S_{CSI}$ signal is generated for cylinder #1. Also, the cylinder ID signal results in a 25% duty cycle signal, with a rise on compression for cylinder #3, and a fall on cylinder #4 secondary rise. The resulting CAM CODES for this condition, as may be determined from FIG. 7I at the determined sampling points, are [1000] and [0010]. To reiterate, in accord with the invention, PCM 20 can determine, not withstanding a fault, that when it receives the CAM CODE [1000], the next correct cylinder up for compression is cylinder #3 (or cylinder #2 when the CAM CODE is [0010]). Likewise, though not shown, for an electrode short on cylinder #2, the cylinder ID signal has a 75% duty cycle, with a rise on cylinder #2 compression, and a fall on cylinder #4 compression. The resulting CAM CODES are [1011] and [1110]. For a shorted electrode on cylinder #3 plug (not shown), the cylinder ID signal has a 25% duty cycle, with a rise on compression for cylinder #1 and a fall on cylinder #3 secondary rise. The resulting CAM CODES are [0001] and [0100] when cylinder #3 and cylinder #2 are up next for compression. For a shorted electrode on cylinder #4 plug (not shown), the cylinder ID signal has a 75% duty cycle, with a rise on compression for cylinder #1, and a fall on compression for cylinder #2. The resulting CAM CODES are [1101] and [0111]. A shorted plug electrode type of fault will generate misfires under all conditions.

Another, fault mode involves mis-gapped spark plugs. It is possible that in the course of engine service, spark plugs may be installed that are not gapped properly. This generally should not present a problem if all the plugs are all gapped equally. However, if the gaps are not equal on paired cylinders (e.g., 1/4 and 2/3 in the illustrated embodiment), it is possible that the compression plug will have a breakdown voltage lower than the exhaust plug (e.g., because of a smaller gap distance). This may cause the sparks to "reverse order" under high manifold vacuum. A "reverse order" is when a cylinder under compression has a spark discharge before the discharge for the cylinder in the exhaust stroke.

FIGS. 7J–7K shows the effect of a misgapped spark plug for cylinder #1 in the $S_{CSI}$ signal, and the resulting cylinder ID signal. The cylinder ID signal will have a 25% duty cycle, with a rise on compression for cylinder #3, and a fall on compression for cylinder #4. The resulting CAM CODES are [1000] and [0010]. Likewise, though not shown, a cylinder #2 plug misgapped fault results in a cylinder ID signal having a 75% duty cycle, with a rise on compression for cylinder #2, and a fall on compression for cylinder #4. The resulting CAM CODES are [1011] and [1110]. A cylinder #3 spark plug misgapped fault (not shown) results in a cylinder ID signal having a 25% duty cycle, with a rise on compression for cylinder #1, and a fall on compression for cylinder #3. The resulting CAM CODES are [0001] and [0100]. For a cylinder #4 spark plug misgapped fault condition (not shown), the cylinder ID signal has a 75% duty cycle, with a rise on compression for cylinder #1, and a fall on the compression of cylinder #2. The resulting CAM CODES are [1101] and [0001]. A misgapped plug fault mode should not generate misfires.

Referring now to FIGS. 7L, and 7M, another fault mode that may occur may be referred to as micro-arcing. This situation may occur when a small gap is present in the ignition coil secondary connection due to, for example, an unseated or incompletely seated spark plug "boot". This gap will generate an additional spark, which if high enough in amplitude may be detected by circuit 48 (shown in FIG. 2). If detected, it is assumed that such a spark will occur before the actual spark event. This is shown in FIG. 7L for a small arc in series with the plug for cylinder #2. The resulting cylinder ID signal shown in FIG. 7M reveals a 75% duty cycle, with a rise on compression for cylinder #2, and a fall on compression for cylinder #4. The resulting CAM CODES are [1001] and [1110]. Likewise, though not shown, arcs may occur on cylinders 1, 3, and 4. For an "arc" fault condition in series with the plug for cylinder 1, the cylinder ID signal will have a 25% duty cycle, with a rise on compression for cylinder #3, and a fall on compression for cylinder #4. The resulting CAM CODES are [1000] and [0010]. For an "arc" condition on cylinder #3, the cylinder ID signal will have a 25% duty cycle, with a rise on compression for cylinder #1, and a fall on compression for cylinder #3. The resulting CAM CODES are [0001] and [0100]. An arcing fault condition on cylinder #4 results in a 75% duty cycle, with a rise on compression for cylinder #1, and a fall on compression for cylinder #2. The resulting CAM CODES are [1101] and [0111]. This "micro-arcing" fault mode may or may not generate misfires, depending on the size of the discontinuity. Inasmuch as the result of this fault manifests itself in a substantially similar manner to misgapped plugs, described above, utilization of MAP information may be used in differentiating between the two.

Referring now to FIGS. 7N and 7O, yet another type of fault involves the loss of the ignition control signal EST1/4 or EST2/3. FIG. 7N shows the compression sense ignition signal $S_{CSI}$ for an EST1/4 signal loss. No spark discharges occur for either cylinders 1 or 4, and therefore, no $S_{CSI}$ signal is generated. FIG. 7O shows the resulting cylinder ID signal, which has a 50% duty cycle, with a rise on compression for cylinder #3, and a fall on compression for cylinder #2. The resulting CAM CODES are [1100] and [0011]. Though not shown, the loss of the EST2/3 signal generally does not affect the cylinder ID signal output, except for the initial cylinder 2/3 firing wherein the cylinder ID signal will have no edge. That is, the initial state of the cylinder ID signal is indeterminate, and is not valid until after the fall of the first ignition control signal provided to the ignition system 10. Should ignition control signal EST2/3 be disconnected, for example, the cylinder ID signal could be at a logic "one" or "zero" at the onset of synchronization. Therefore, the resulting CAM CODES will be [0001] or [1001] when the correct, next cylinder up for compression is cylinder #3. Alternatively, the CAM CODES will be [0100] or [1110] when the correct, next cylinder up for compression is cylinder #2.

The predetermined data derived from the foregoing can be arranged in a data structure such as shown in Table 1, in the form of a look-up table, which may be stored in ROM or other non-volatile memory associated with PCM 20.

The data structure includes an input parameter. The input parameter, preferably the 4-bit CAM CODE, may assume a plurality of unique values corresponding to the presence of one or more fault modes associated with either the engine or ignition system. The data structure also includes an output parameter indicative of absolute engine position, preferably, a "last cylinder under compression" parameter. Each input parameter value (i.e., CAM CODE) has a corresponding output parameter value (i.e., cylinder #) associated therewith.

TABLE 1

| STATE | | CAM CODE | | | | LAST CYLINDER UNDER |
|---|---|---|---|---|---|---|
| (DEC) | (HEX) | BIT3 | BIT2 | BIT1 | BIT0 | COMPRESSION |
| 0 | 0 | 0 | 0 | 0 | 0 | INDETERMINATE |
| 1 | 1 | 0 | 0 | 0 | 1 | #1 COMPRESSION |
| 2 | 2 | 0 | 0 | 1 | 0 | #4 COMPRESSION |
| 3 | 3 | 0 | 0 | 1 | 1 | #4 COMPRESSION |
| 4 | 4 | 0 | 1 | 0 | 0 | #4 COMPRESSION |
| 5 | 5 | 0 | 1 | 0 | 1 | INDETERMINATE |
| 6 | 6 | 0 | 1 | 1 | 0 | #4 COMPRESSION |
| 7 | 7 | 0 | 1 | 1 | 1 | #4 COMPRESSION |
| 8 | 8 | 1 | 0 | 0 | 0 | #1 COMPRESSION |
| 9 | 9 | 1 | 0 | 0 | 1 | #1 COMPRESSION |
| 10 | A | 1 | 0 | 1 | 0 | INDETERMINATE |
| 11 | B | 1 | 0 | 1 | 1 | #1 COMPRESSION |
| 12 | C | 1 | 1 | 0 | 0 | #1 COMPRESSION |
| 13 | D | 1 | 1 | 0 | 1 | #1 COMPRESSION |
| 14 | E | 1 | 1 | 1 | 0 | #4 COMPRESSION |
| 15 | F | 1 | 1 | 1 | 1 | INDETERMINATE |

Through routine application of standard programming practices, PCM 20 can be configured to determine the last cylinder under compression based on a four-BIT input pattern (i.e., the CAM CODE). BIT3 of Table 1 corresponds to the earliest-in-time sample of the cylinder ID signal (i.e., the first sample taken at crank pulse #3). BIT0 is the most recent sample of the cylinder ID signal (i.e., the second crank pulse #6 sampling). BIT2 and BIT1 correspond to the intervening samples taken at the first #6 crank pulse, and the second #3 crank pulse, respectively. During operation of engine 12, ignition system 10 is operative for generating the cylinder ID signal in accordance with the compression sense strategy described above. The cylinder ID signal is then sampled at predetermined intervals to yield a CAM CODE. PCM 20 is then operative for selecting one of the output parameter values (i.e., cylinder # last under compression) based on the determined CAM CODE.

Inasmuch as the firing order in the illustrated embodiment is known (e.g., 1-3-4-2), and which ignition coil was last commanded to be fired, knowledge of the last cylinder under compression from the data structure can be used by PCM 20 to determine the next, correct cylinder for compression/firing (e.g., what cylinder will need fuel delivery scheduled). Correct absolute engine position information can thus be maintained, even during fault modes.

Also from the foregoing, another data structure may be organized for detecting the fault(s) that may exist in the engine or ignition system. This data structure may comprise a map or lookup table, as shown in Table 2.

Table 2 may also be implemented through a programmed approach in PCM 20.

A plurality of fault modes are defined in the data structure shown in Table 2 primarily as a function of the sampled cylinder ID signal (i.e., CAM CODE). During operation of engine 12, ignition system 10 is operative for generating the cylinder ID signal in accordance with the compression sense strategy described above. The cylinder ID signal is then sampled by PCM 20 to form the CAM CODE, in a preferred embodiment. PCM 20 is then operative for selecting at least one of the fault modes contained in the data structure using the CAM CODE. In further embodiments, PCM 20 selects the fault mode further as a function of MAP information, and information regarding whether a misfire occurred in the cylinder. PCM 20 may generate a diagnostic signal indicating that a fault has been detected (and what the fault was).

TABLE 2

| D/C | RISE | FALL | MAP | MISFIRE? | FAILURE MODE | CAM CODE |
|---|---|---|---|---|---|---|
| 25% | 3 | 4 | NORMAL | Y | F1, S1 | 1000, 0010 |
| 25% | 3 | 4 | LOW | N | MG1, C1 | 1000, 0010 |
| 25% | 3 | 4 | NORMAL | N | A1 | 1000, 0010 |
| 25% | 1 | 3 | NORMAL | Y | F3, S3 | 0001, 0100 |
| 25% | 1 | 3 | LOW | N | MG3, C3 | 0001, 0100 |
| 25% | 1 | 3 | NORMAL | N | A3 | 0001, 0100 |
| 75% | 2 | 4 | NORMAL | Y | S2 | 1011, 1110 |
| 75% | 2 | 4 | LOW | N | MG2, C2 | 1011, 1110 |
| 75% | 2 | 4 | NORMAL | N | A2 | 1011, 1110 |
| 75% | 1 | 2 | NORMAL | Y | S4 | 1101, 0111 |
| 75% | 1 | 2 | LOW | N | MG4, C4 | 1101, 0111 |
| 75% | 1 | 2 | NORMAL | N | A4 | 1101, 0111 |
| 50% | 3 | 2 | NORMAL | Y | L(1/4) | 1100, 0011 |
| 50% | 1 | 4 | NORMAL | Y | L(2/3) | 0001, 1001 |
| | | | | | | 0110, 1110 |
| 50% | 1 | 4 | HIGH | Y | F2, F4 | 1001, 0110 |

Where:

D/C=Duty Cycle

F(X)=#X plug fouled

S(X)=#X plug electrodes shorted

MG(X)=#X plug gap smaller than that of the paired cylinder; cylinder pairs are 1/4 and 2/3

A(X)=small arc in series with plug #X

L(X/Y)=loss of EST(X/Y)

C(X)=low compression on cylinder #X

Thus, based on the CAM CODE, and optionally MAP information and, knowledge of whether a misfire occurred, at least one, or perhaps two, fault modes may be identified.

An ignition system in accordance with the invention provides for accurate and reliable determination of absolute engine position. Additionally, predetermined faults may be detected and indicated for use by service. Finally, an improved sensing structure provides relatively stable ignition signals, due to a reduction of capacitive dielectric variance.

It is to be understood that the above description is merely exemplary rather than limiting in nature, the invention being limited only by the appended claims. Various modifications and changes may be made thereto by one of ordinary skill in the art which embody the principles of the invention and fall within the spirit and scope thereof.

We claim:

1. A direct ignition apparatus comprising:

a housing;

a pair of ignition coils disposed in the housing each having a secondary winding configured to develop an ignition voltage at respective first ends thereof, each one of said first ends being configured to be connected to first and second spark plugs disposed proximate a corresponding cylinder of an internal combustion engine, said ignition voltage being configured to cause said spark plugs to produce respective spark discharges;

a sensing conductive element including a generally planar portion disposed a predetermined distance from said pair of ignition coils;

dielectric material substantially occupying a space between said pair of ignition coils and said sensing conductive element; and, an ignition signal processing circuit electrically connected to said sensing conductive element to sense said spark discharges capacitively coupled to said conductive element from said pair of ignition coils.

2. The apparatus of claim 1 wherein said housing comprises plastic material.

3. The apparatus of claim 1 wherein said sensing conductive element is substantially surrounded with a plastic material.

4. The apparatus of claim 1 wherein said dielectric material includes a first layer of epoxy potting material.

5. The apparatus of claim 1 wherein said dielectric material includes a second layer of plastic material surrounding said sensing element.

6. The apparatus of claim 5 wherein said sensing conductive element has a first end, said plastic material at said first end of said sensing element being configured to form a first portion of a locating feature, said housing having a second portion of said locating feature formed therein, said first portion being configured to matingly engage said second portion to thereby retain said sensing conductive element said predetermined distance from said pair of ignition coils.

7. The apparatus of claim 1 wherein each secondary winding of said pair of ignition coils includes a respective second end configured to be connected to third and fourth spark plugs.

8. The apparatus of claim 1 wherein said sensing conductive element defines a first portion of a compression sense leadframe assembly, said leadframe assembly further including power conducting elements coupled to said pair of ignition coils, said sensing conductive element being spaced apart from said power conducting elements to thereby reduce coupling noise associated with a primary current flowing through said power conducting elements.

9. A method of determining a fault mode in an ignition system for an internal combustion engine having a plurality of cylinders, said method comprising the steps of:

(A) defining a plurality of fault modes associated with one of the engine and the ignition system as a function of a cylinder identification signal indicative of an occurrence of a combustion event in each of the respective cylinders;

(B) generating the cylinder identification signal in accordance with a compression sense detection strategy; and, (C) selecting at least one of the fault modes defined in step (A) using the cylinder identification signal generated in step (B).

10. The method of claim 9 wherein step (A) includes the substeps of:

selecting at least one fault mode from a fouled spark plug condition, a shorted spark plug electrode condition, a spark plug gap mismatch condition, a spark plug circuit series arc condition, a cylinder low compression condition, and a loss of ignition control signal condition;

determining an identifying sequence for the cylinder identification signal indicative of the selected fault mode; and, associating the cylinder identification signal having the determined identifying sequence with the selected fault mode.

11. The method of claim 10 wherein step (A) further includes the substep of:

determining a manifold absolute pressure condition under which the selected fault mode occurs; and, associating the determined MAP condition with the selected fault mode.

12. The method of claim 9 wherein step (B) includes the substeps of:

generating an ignition signal associated with a spark discharge in at least one of the cylinders;

processing the ignition signal to generate the cylinder identification signal.

13. The method of claim 12 further including the step of:

determining a correct cylinder identification using the cylinder identification signal.

14. The method of claim 10 wherein step (C) includes the substeps of:

sampling the cylinder identification signal at preselected intervals to generate the identifying sequence;

retrieving from a memory the determined fault mode using the identifying sequence.

15. A detection apparatus for determining a fault mode in an ignition on system for an internal combustion engine having a plurality of cylinders, said detection apparatus comprising:

a controller having a memory which includes predetermined data defining a plurality of fault modes of at least one of said engine and said ignition system, each one of said fault modes being defined as a function of a cylinder identification signal indicative of an occurrence of a respective combustion event in each of said cylinders;

an ignition system configured to generate said cylinder identification signal in accordance with a plurality of sensed spark discharge characteristics corresponding to respective compression strokes in said cylinders;

wherein said controller is further configured to select at least one of said fault modes in response to said cylinder identification signal.

16. The apparatus of claim 15 wherein said ignition system includes:

a sensing conductive element having a planar portion proximate a first and a second ignition coil configured to sense said spark discharge characteristics.

17. The apparatus of claim 16 wherein said ignition system further includes dielectric material between said sensing conductive element and said first and second ignition coils, said dielectric material comprising a first layer of epoxy potting material and a second layer of plastic material.

18. The apparatus of claim 17 wherein said planar portion of said sensing element is spaced a predetermined distance from said first and second ignition coils, said first and second layers of dielectric material substantially occupying a space defined between said coils and said sensing conductive element.

19. The apparatus of claim 15 further including:

a manifold absolute pressure sensor configured to generate a manifold pressure signal;

wherein said controller is configured to select said at least one fault mode further as a function of said manifold absolute pressure signal.

20. The apparatus of claim 19, wherein said controller is configured to generate a diagnostic signal when said at least one fault mode has been selected.

21. A method for determining absolute engine position for a multi-cylinder internal combustion engine, comprising the steps of:

(A) defining a cylinder identification signal indicative of a respective combustion event in each of the cylinders;

(B) providing a data structure having an input parameter and an output parameter, the input parameter having a plurality of values corresponding to the cylinder identification signal in the presence of one or more fault modes, each input parameter having a respective output parameter associated therewith indicative of absolute engine position;

(C) generating the cylinder identification signal in accordance with a compression sense detection strategy; and, (D) selecting one of the output parameters contained in the data structure using the cylinder identification signal generated in step (C).

22. The method of claim 21 wherein step (B) includes the substeps of:

generating one of the fault modes;

generating the cylinder identification signal;

sampling the generated cylinder identification signal to produce an n-bit word pattern;

storing the n-bit word pattern in the data structure; and, associating an output parameter value indicative of an actual absolute engine position with the n-bit word.

23. The method of claim 22 wherein said associating step includes the substeps of:

selecting one of the output parameter values indicative of absolute engine position based on an actual absolute engine position.

24. The method of claim 21 wherein step includes the substeps of:

converting the cylinder identification signal into an n-bit word pattern;

traversing the data structure using the n-bit word pattern as an index; and, retrieving one of the output parameter values indicative of absolute engine position.

* * * * *